United States Patent
Yang et al.

(10) Patent No.: US 9,047,433 B2
(45) Date of Patent: Jun. 2, 2015

(54) CELL AND MACRO PLACEMENT ON FIN GRID

(71) Applicant: Taiwan Semiconductor Manufacturing Company, Ltd., Hsin-Chu (TW)

(72) Inventors: Kuo-Nan Yang, Hsin-Chu (TW); Chou-Kun Lin, Hsin-Chu (TW); Jerry Chang-Jui Kao, Taipei (TW); Yi-Chuin Tsai, Sing-Yan Township (TW); Chien-Ju Chao, New Taipei (TW); Chung-Hsing Wang, Baoshan Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/874,027

(22) Filed: Apr. 30, 2013

(65) Prior Publication Data
US 2014/0245248 A1 Aug. 28, 2014

Related U.S. Application Data

(60) Provisional application No. 61/770,224, filed on Feb. 27, 2013.

(51) Int. Cl.
*G06F 17/50* (2006.01)
(52) U.S. Cl.
CPC .................................. *G06F 17/5072* (2013.01)
(58) Field of Classification Search
USPC ......................................................... 716/122
See application file for complete search history.

(56) References Cited

U.S. PATENT DOCUMENTS

| | | |
|---|---|---|
| 2005/0044522 A1 | 2/2005 | Maeda |
| 2006/0214233 A1* | 9/2006 | Ananthanarayanan et al. .............. 257/353 |
| 2010/0155776 A1* | 6/2010 | Lee ................. 257/173 |
| 2011/0134684 A1* | 6/2011 | Marshall et al. ............. 365/154 |
| 2012/0280331 A1* | 11/2012 | Ou et al. ........................ 257/401 |
| 2013/0126978 A1* | 5/2013 | Becker et al. ................. 257/369 |

FOREIGN PATENT DOCUMENTS

JP 200572133 3/2005

* cited by examiner

*Primary Examiner* — Paul Dinh
*Assistant Examiner* — Bryce Aisaka
(74) *Attorney, Agent, or Firm* — Slater & Matsil, L.L.P.

(57) ABSTRACT

A die includes at least one standard cell, which includes a first boundary and a second boundary opposite to the first boundary. The first boundary and the second boundary are parallel to a first direction. The at least one standard cell further includes a first plurality of FinFETs including first semiconductor fins parallel to the first direction. The die further includes at least one memory macro, which has a third boundary and a fourth boundary opposite to the third boundary. The third boundary and the fourth boundary are parallel to the first direction. The at least one memory macro includes a second plurality of FinFETs including second semiconductor fins parallel to the first direction. All semiconductor fins in the at least one standard cell and the at least one memory macro have pitches equal to integer times of a minimum pitch of the first and the second semiconductor fins.

20 Claims, 3 Drawing Sheets

CELL AND MACRO PLACEMENT ON FIN GRID

This application claims the benefit of the following provisionally filed U.S. patent application: application Ser. No. 61/770,224, filed Feb. 27, 2013, and entitled "Cell and Macro Placement on Fin Grid," which application is hereby incorporated herein by reference.

BACKGROUND

With the increasing down-scaling of integrated circuits and increasingly demanding requirements to the speed of integrated circuits, transistors need to have increasingly higher drive currents and smaller dimensions. To meet these conflicting requirements, Fin Field-Effect Transistors (FinFETs) were developed. FinFETs have greater channel widths than planar transistors. The increase in the channel widths is achieved by forming channels that include portions on the sidewalls of semiconductor fins and portions on the top surfaces of the semiconductor fins. Since the drive currents of transistors are proportional to the channel widths, the drive currents of the FinFETs are increased over that of planar transistors.

FinFETs are also made smaller and smaller, and the fins of the FinFETs are made thinner and thinner. To form such small fins, special optical technique such as diffraction and interference were used. This causes the formation process of the fins to be more complex.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

A semiconductor die and integrated circuits formed therein and the method of forming the same are provided in accordance with various exemplary embodiments. The intermediate stages of forming the die are illustrated. The variations of the embodiments are discussed. Throughout the various views and illustrative embodiments, like reference numbers are used to designate like elements.

Figure 1:
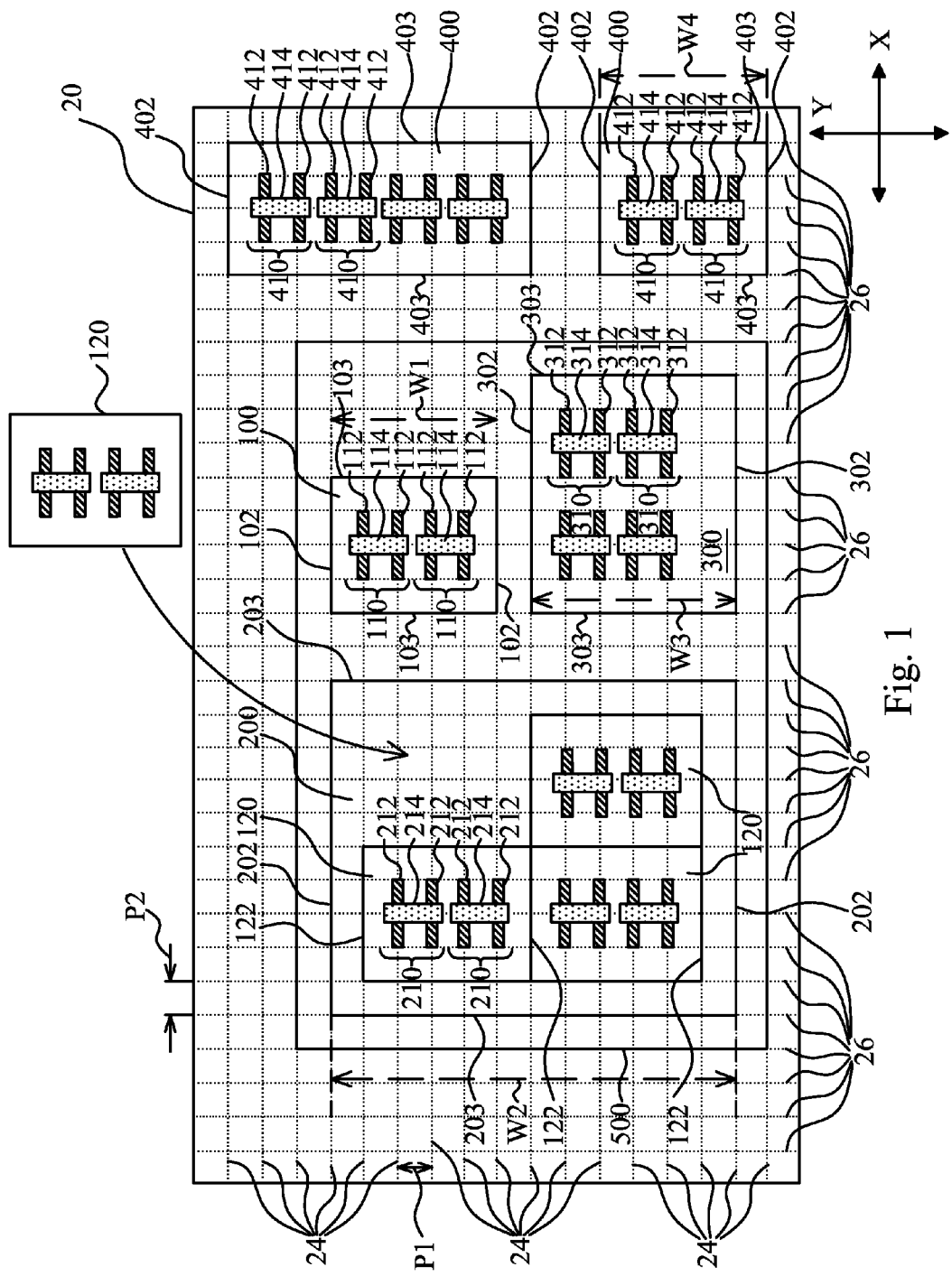
FIG. 1 illustrates a die representation in accordance with exemplary embodiments and the circuits laid out in the die representation.
Figure 3:
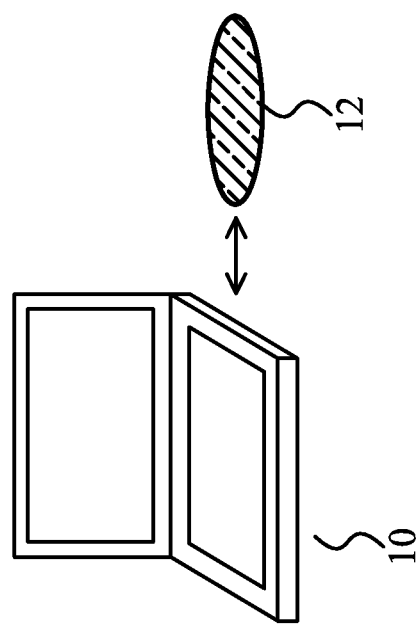
FIG. 3 schematically illustrates a computer for laying out the die representation and the storage medium for storing the layout of the die representation.

FIG. 1 illustrates a placement step in the design of integrated circuits. In accordance with some embodiments, the placement step is performed using computer 10 (FIG. 3), which runs the software for designing integrated circuits. The software includes a circuit layout tool, which has the function of placement and routing. The layout tool is configured to place standard cells and macros, which are pre-designed functional circuits. Throughout the description, the terms "standard cell" and "macro" refer to the pre-designed cells that have been laid out. Also, the terms "standard cell" and "macro" are used interchangeably, while the term "standard cell" is generally used to refer to small cells, and the term "macro" is generally used to refer to large cells with more functions. The standard cells and macros are stored in circuit libraries, which may be in the form of a database. Furthermore, the standard cells and macros (and the respective database) are stored in tangible storage medium such as hard drive 12 (FIG. 3). Computer 10 is electrically and signally coupled to hard drive 12, and may retrieve the standard cells and macros from hard drive 12 to perform the placement.

Figure 2:
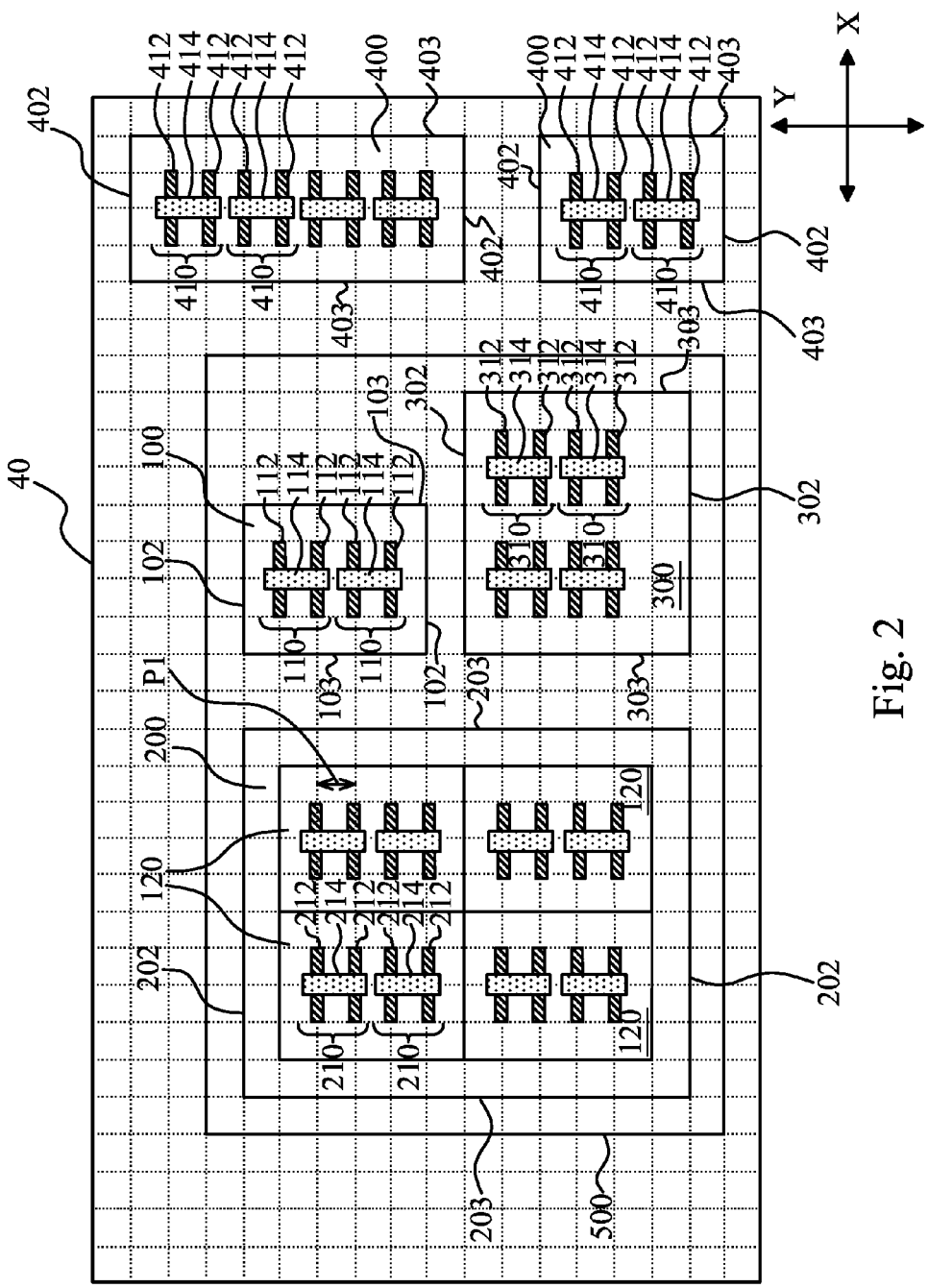
FIG. 2 illustrates a semiconductor die in accordance with exemplary embodiments and the circuits manufactured in the die.

FIG. 1 illustrates die representation 20, which is designed by the circuit design tool. Die representation 20 is a representation of a die, and is run in computer 10. Die representation 20 may be a part of a wafer (not shown) representation, which includes a plurality of identical die representation 20. The designed circuit in wafer/die representation 20 is manufactured in die/wafer 40, as shown in FIG. 2. Referring back to FIG. 1, die representation 20 includes a plurality of lines 24 extending in the X-direction. Lines 24 are distributed throughout die representation 20, and have equal spacing P1. Throughout the description, spacing P1 is referred to as pitch P1. In some embodiments, die representation 20 also includes a plurality of lines 26 extending in the Y-direction, which is perpendicular to the X-direction. Lines 26 may also be distributed throughout die representation 20, and have a uniform pitch P2. Pitch P1 may be equal to, greater than, or smaller than pitch P2. In alternative embodiments, die representation 20 does not include lines 26. Lines 24 and 26 are referred to hereinafter as grid lines. Lines 24 and 26 are visible on the screen of computer 10 (FIG. 1).

Integrated circuits such as standard cells 100, memory macro 200, analog macro 300, and Input/output (IO) macro 400 are placed in die representation 20, and aligned to grid lines 24. For example, standard cells 100 may include inverters, NOR gates, NAND gates, XOR gates, and the like. Memory macro 200 may include a Static Random Access Memory (SRAM) macro, a Dynamic Random Access Memory (DRAM) macro, or the like. The SRAM macro or the DRAM macro includes SRAM cells or DRAM cells forming an array, and may include the supporting circuits for supporting the operation of the memory array. The supporting circuits may include row decoders, sense amplifier, power gating circuitry, and level shifter circuitry, for example. Analog macro 300 may include phase lock loop, operational amplifier, power amplifier, and/or the like. IO macro 400 may include high speed Serializer/Deserializer (serdes), general purpose IO block, Electro-Static Discharging (ESD) circuitry, and/or the like. Circuits 100, 200, 300, and 400 may be pre-designed, and are copied to the desirable locations of die representation 20, although some of circuits 100, 200, 300, and 400 may also be in-situ laid out in die representation 20 piece by piece, rather than pre-designed and placed. FIG. 1 illustrates an exemplary placement step of one of memory cells 120. In some embodiments, standard cells 100, memory macro 200, and analog macro 300 are included in core circuit region 500, and IO macros 400 may be allocated in the IO regions of die representation 20.

Throughout the description, when a standard cell or macro is referred to as aligned to grid lines 24, the boundaries of the respective standard cell or macro are aligned to grid lines 24. For example, boundaries 102, 202, 302, and 402 of standard cells 100, memory macro 200, analog macro 300, and IO macro 400, respectively, are aligned to grid lines 24. The transistors in standard cells 100, memory macro 200, analog macro 300, and IO macro 400 may be Fin Field-Effect Transistors (FinFETs), which include semiconductor fins and gate electrodes over the semiconductor fins. For example, standard cell 100 includes transistors 110 including fins 112 and gate electrodes 114, memory macro 200 includes transistors 210 including fins 212 and gate electrodes 214, IO macro 300 includes transistor 310 including fins 312 and gate electrodes 314, and IO macro 400 includes transistors 410 including fins 412 and gate electrodes 414. In accordance with some embodiments, when a standard cell or macro is referred to as aligned to grid lines 24, the fins of the FinFETs in the standard cell or macro may be aligned to grid lines 24. For example, the middle lines of the fins 112, 212, 312, and 412 are aligned to the respective grid lines 24, although the boundaries of the fins 112, 212, 312, and 412 may also be aligned to grid lines 24 in alternative embodiments. Fins 112, 212, 312, and 412 may have lengthwise directions parallel to the X direction.

Memory macro 200 also includes a plurality of memory cells 120, which may be SRAM cells or DRAM cells, for example. FIG. 1 illustrates that one memory cell 120 is being placed into memory macro 200. In alternative embodiments, an entire memory macro 200 is pre-built, and an entirety of memory macro 200 is placed in die representation 20 at one time. The boundaries 122 of memory cells 120 may also aligned to grid lines 24.

It is observed that since fins 112, 212, 312, and 412 are aligned to grid lines 24, which have equal pitch P1, the pitches of all of fins 112, 212, 312, and 412 are equal to N*P1, wherein N is an integer equal to or greater than 0. Pitch P1 is also the minimum pitch of all fins 112, 212, 312, and 412. Alternatively stated, the pitches of all of fins 112, 212, 312, and 412 are equal to the integer times of the pitch P1 of grid lines 24. To determine pitches of fins that are not aligned in the Y direction, extension lines may be drawn by extending fins (such as fin 112) to obtain extension lines, and the pitches of the extension lines can be determined since the extension lines are parallel to each other and are aligned to grid lines 24. For example, the illustrated fins 112 and some of fins 412 are not aligned in the Y-direction. However, their extension lines, which are also grid lines 24, have pitches equal to N*P1.

In some embodiments, all of fins of all FinFETs throughout die representation 20 have lengthwise directions parallel to the X direction, and no fin, or substantially no fin, has lengthwise direction extending in the Y direction. Furthermore, no fin, or substantially no fin throughout die representation 20 is misaligned with grid lines 24. In alternative embodiments, some fins in one or more of standard cells 100, memory macro 200, analog macro 300, and IO macro 400 are misaligned with grid lines 24, while the remaining ones of standard cells 100, memory macro 200, analog macro 300, and IO macro 400 have their fins aligned to grid lines 24. Gate electrodes 114, 214, 314, and 414 are perpendicular to fins 112, 212, 312, and 412, and have lengthwise directions parallel to the Y-direction.

Since boundaries 102, 202, 302, and 402 of standard cells 100, memory macro 200, analog macro 300, and IO macro 400, respectively, are aligned to grid lines 24, the width W1, W2, W3 and W4 (which are the distances between opposite boundaries) of standard cells 100, memory macro 200, analog macro 300, and IO macro 400, respectively, are designed to be integer times pitch P1.

Standard cells 100, memory macro 200, analog macro 300, and IO macro 400 also include boundaries 103, 203, 303, and 403, respectively, which are parallel to the Y direction. In accordance with some embodiments, boundaries 103, 203, 303, and 403 are not forced to align to grid lines 26. Hence, boundaries 103, 203, 303, and 403 may be aligned to or misaligned with grid lines 26 in a random pattern. In alternative embodiments, boundaries 103, 203, 303, and 403 are forced to align to grid line 26. Gate electrodes 114, 214, 314, and 414 in standard cells 100, memory macro 200, analog macro 300, and IO macro 400 may also be aligned to grid lines 26, although in alternative embodiments, they are not aligned to grid lines 26.

The circuit design in FIG. 1 may be stored in the tangible storage medium 12 in FIG. 3. The circuit design of die representation 20 may be used to manufacture integrated circuits. FIG. 2 illustrates physical semiconductor die 40, which is manufactured on semiconductor wafers using the circuit design in die representation 20. Hence, each of the components shown in FIG. 2 reflects the design in FIG. 1. It is appreciated that in die 40, grid lines 24 and 26 are no longer visible anymore. In FIG. 2, however, the grid lines are still illustrated for reference purpose. Fins 112, 212, 312, and 412, however, are distinguishable. Furthermore, the boundaries of at least some standard cells 100, memory macro 200, analog macro 300, and IO macro 400 can be found, for example, through their defining characteristic features. For example, standard cells may include dummy polysilicon (or dummy gate electrode formed of other materials other than polysilicon) lines, which may be either electrically floating, or tied to VDD or VSS. The middle lines of the dummy silicon lines may be aligned to the boundaries of standard cells 100. In addition, since standard cells 100, memory macro 200, analog macro 300, and IO macro 400 may be repeated in die 40, the boundaries of standard cells 100, memory macro 200, analog macro 300, and IO macro 400 may also be determined by comparing the repeating patterns.

Although grid lines 24 and 26 (FIG. 1) are not present in die 40, the extension lines of fins 112, 212, 312, and 412 may be identified, and the pitches of the extension lines may be determined, which will be equal to multiple times pitch P1. In these embodiments, minimum pitch P1 may be determined by looking for the smallest pitches of fins 112, 212, 312, and 412. In accordance with some embodiments, the extension line of one of fins 112, 212, 312, and 412 may be selected as a reference line, and the pitches of all other fins may be determined by measuring the distance between the distances between the extension lines of other fins and the reference line.

In the embodiments of the present disclosure, by aligning the fins of standard cells, memory macros, analog macros, and IO macros to grid lines of a die or a wafer, the formation of very narrow fins is made possible since the formation of the fins may use some diffraction techniques, and hence all fins aligned to the same grid lines may be formed simultaneously and sharing the same process steps. If, however, some fins are not aligned to the same grid lines of some other fins, and/or some fins have lengthwise directions perpendicular to other fins, the fins have to be formed separately, and the manufacturing cost is increased.

In accordance with some embodiments, a die includes at least one standard cell, which includes a first boundary and a second boundary opposite to the first boundary. The first boundary and the second boundary are parallel to a first direction. The at least one standard cell further includes a first plurality of FinFETs including first semiconductor fins parallel to the first direction. The die further includes at least one memory macro, which has a third boundary and a fourth boundary opposite to the third boundary. The third boundary and the fourth boundary are parallel to the first direction. The at least one memory macro includes a second plurality of FinFETs including second semiconductor fins parallel to the first direction. All semiconductor fins in the at least one standard cell and the at least one memory macro have pitches equal to integer times of a minimum pitch of the first semiconductor fins and the second semiconductor fins.

In accordance with other embodiments, a die includes a standard cell and a macro selected from the group consisting essentially of a memory macro, an analog macro, an Input/output macro, and combinations thereof. The die further includes a FinFET in each of the standard cell and the macro. Substantially all semiconductor fins for forming all FinFETs in the die are parallel to a first direction. Pitches of the all semiconductor fins are equal to integer times a minimum pitch among the pitches. The minimum pitch is a smallest pitch of the all pitches of the all semiconductor fins.

In accordance with yet other embodiments, a method includes placing a standard cell into a die representation, wherein the step of placing the standard cell is performed using a computer. A first boundary and a second boundary of the standard cell are aligned to a first grid line and a second grid line, respectively. The grid is distributed throughout the die representation. The method further includes placing a macro into the die representation, wherein a third boundary and a fourth boundary of the macro are aligned to a third grid line and a fourth grid line, respectively. The first, the second, the third, and the fourth grid lines belong to grid lines of a grid have a uniform pitch. The macro is selected from a memory macro, an analog macro, an Input/output macro, and combinations thereof.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A die comprising:
    at least one standard cell comprising:
        a first boundary and a second boundary opposite to the first boundary, wherein the first boundary and the second boundary are parallel to a first direction;
        a first plurality of Fin Field-Effect Transistors (FinFETs) comprising first semiconductor fins parallel to the first direction, with the first semiconductor fins having a first pitch; and
    at least one memory macro, wherein the at least one standard cell and the at least one memory macro are different types of cells, comprising:
        a third boundary and a fourth boundary opposite to the third boundary, wherein the third boundary and the fourth boundary are parallel to the first direction; and
        a second plurality of FinFETs comprising second semiconductor fins parallel to the first direction, with the second semiconductor fins have a second pitch, wherein all semiconductor fins in the at least one standard cell and all semiconductor fins in the at least one memory macro have pitches equal to integer times of a minimum pitch of the first semiconductor fins and the second semiconductor fins, and wherein one of the first pitch and the second pitch is greater than the minimum pitch, and a first distance between the first boundary and the second boundary and a second distance between the third boundary and the fourth boundary are equal to integer times of a minimum pitch, with the integer times being greater than one time.

2. The die of claim 1 further comprising:
    at least one analog macro comprising:
        a fifth boundary and a sixth boundary opposite to the third boundary, wherein the fifth boundary and the sixth boundary are parallel to the first direction; and
        a third plurality of FinFETs comprising third semiconductor fins parallel to the first direction, wherein pitches of all semiconductor fins in the at least one analog macro are equal to integer times of the minimum pitch.

3. The die of claim 1 further comprising:
    at least one Input/output (JO) macro comprising:
        a fifth boundary and a sixth boundary opposite to the third boundary, wherein the fifth boundary and the sixth boundary are parallel to the first direction; and
        a third plurality of FinFETs comprising third semiconductor fins parallel to the first direction, wherein pitches of all semiconductor fins in the at least one IO macro are equal to integer times of the minimum pitch.

4. The die of claim 1, wherein substantially all semiconductor fins of all FinFETs in the die have lengthwise directions parallel to the first direction, and wherein substantially all pitches of all semiconductor fins of all FinFETs in the die are equal to integer times of the minimum pitch.

5. The die of claim 4, wherein all semiconductor fins of all FinFETs in the die have lengthwise directions parallel to the first direction, and wherein all pitches of all semiconductor fins of all FinFETs in the die are equal to integer times of the minimum pitch.

6. The die of claim 1, wherein substantially no semiconductor fin of any FinFET in the die has a lengthwise direction parallel to a second direction perpendicular to the first direction.

7. The die of claim 1, wherein the at least one standard cell is selected from the group consisting of an inverter, an NOR gate, an NAND gate, an XOR gate, and combinations thereof.

8. A die comprising:
    a standard cell;
    a macro comprising an analog macro, wherein the analog macro comprises an operational amplifier macro; and
    a Fin Field-Effect Transistor (FinFET) in each of the standard cell and the macro, wherein substantially all semiconductor fins for forming all FinFETs in the die are parallel to a first direction, and wherein pitches of the all semiconductor fins are equal to integer times a minimum pitch among the pitches, and wherein the minimum pitch is a smallest pitch of the all pitches of the all semiconductor fins, and the pitches of the all semiconductor fins comprise a first pitch equal to the minimum pitch, and a second pitch greater than the minimum pitch.

9. The die of claim 8, wherein the macro further comprises a memory macro, and wherein the memory macro comprises a Static Random Access Memory (SRAM) cell.

10. The die of claim 9, wherein the memory macro comprises a first boundary and a second boundary parallel to the first direction, and wherein a distance between the first boundary and the second boundary is equal to integer times the minimum pitch.

11. The die of claim 8, wherein the macro further comprises an IO macro, and wherein the IO macro comprises an Electro Static Discharge (ESD) macro.

12. The die of claim 8, wherein substantially no semiconductor fin in the die has a lengthwise direction perpendicular to the first direction.

13. The die of claim 8, wherein the integer times is greater than one time.

14. The die of claim 8, wherein the standard cell is selected from the group consisting of an inverter, an NOR gate, an NAND gate, an XOR gate, and combinations thereof.

15. A method comprising:
   placing a standard cell into a die representation, wherein the step of placing the standard cell is performed using a computer, wherein a first boundary and a second boundary of the standard cell are aligned to a first grid line and a second grid line, respectively, and wherein the grid is distributed throughout the die representation; and
   placing a macro into the die representation, with the standard cell and the macro being different types of cells, wherein a third boundary and a fourth boundary of the macro are aligned to a third grid line and a fourth grid line, respectively, and wherein the first, the second, the third, and the fourth grid lines belong to grid lines of a grid have a uniform pitch, and wherein the macro is selected from a memory macro, an analog macro, an Input/output macro, and combinations thereof, wherein at least one of the placing the standard cell and the placing the macro is performed using a computer, wherein when a design of the die representation is finished, all fins of all FinFETs in the die representation are aligned to the grid lines, and first fins of the standard cell have a first pitch, and second fins of the macro have a second pitch, and a first one of the first pitch and the second pitch is greater than the uniform pitch, and a second one of the first pitch and the second pitch is equal to the uniform pitch.

16. The method of claim 15, wherein after the steps of placing the standard cell and the macro, all fins of all Fin Field-Effect Transistors (FinFETs) in the standard cell and the macro are aligned to the grid lines.

17. The method of claim 15, wherein the macro comprises a memory macro.

18. The method of claim 15, wherein the macro comprises an analog macro.

19. The method of claim 15, wherein the macro comprises an Input/output (JO) macro.

20. The method of claim 15, when the design of the die representation is finished, all fins of all FinFETs in the die representation have lengthwise direction parallel to each other.

* * * * *

UNITED STATES PATENT AND TRADEMARK OFFICE
CERTIFICATE OF CORRECTION

PATENT NO.       : 9,047,433 B2                                    Page 1 of 1
APPLICATION NO.  : 13/874027
DATED            : June 2, 2015
INVENTOR(S)      : Kuo-Nan Yang et al.

It is certified that error appears in the above-identified patent and that said Letters Patent is hereby corrected as shown below:

In the claims,
In Col. 6, line 28, claim 3, delete "(JO)" and insert --(IO)--.

Signed and Sealed this
Twentieth Day of October, 2015

Michelle K. Lee
*Director of the United States Patent and Trademark Office*